(12) United States Patent
Goedknegt et al.

(10) Patent No.: US 9,060,442 B2
(45) Date of Patent: Jun. 16, 2015

(54) SYSTEM FOR CONTROLLING ELECTRICAL EQUIPMENT UNITS

(75) Inventors: Pieter Gerardus Goedknegt, Maassluis (NL); Robertus Everardus Antonius van der Heiden, Maassluis (NL); Wilhelmus Jacobus Maria Smit, Melissant (NL); Johannes Arie De Bruijn, Alphen aan den Rijn (NL)

(73) Assignee: ORGA HOLDING B.V. (NL)

( * ) Notice: Subject to any disclaimer, the term of this patent is extended or adjusted under 35 U.S.C. 154(b) by 306 days.

(21) Appl. No.: 13/202,540

(22) PCT Filed: Feb. 22, 2010

(86) PCT No.: PCT/NL2010/050087
§ 371 (c)(1),
(2), (4) Date: Oct. 27, 2011

(87) PCT Pub. No.: WO2010/095945
PCT Pub. Date: Aug. 26, 2010

(65) Prior Publication Data
US 2012/0033396 A1 Feb. 9, 2012

(30) Foreign Application Priority Data

Feb. 20, 2009 (NL) .................................... 2002548

(51) Int. Cl.
*H05K 7/02* (2006.01)
*H05K 7/04* (2006.01)
*H05K 7/14* (2006.01)
*H02B 1/28* (2006.01)

(52) U.S. Cl.
CPC ................ *H05K 7/1481* (2013.01); *H02B 1/28* (2013.01); *H05K 7/1467* (2013.01)

(58) Field of Classification Search
CPC .............. H02B 1/28; H02B 1/56; A62C 3/00; H01H 9/047; H01H 9/04; H01H 9/042; H05K 7/1481; H05K 7/1467
USPC ............. 361/600, 679.01, 748, 752, 728, 807
See application file for complete search history.

(56) References Cited

U.S. PATENT DOCUMENTS

| | | | | |
|---|---|---|---|---|
| 5,422,494 | A | * | 6/1995 | West et al. ..................... 250/551 |
| 2007/0005159 | A1 | * | 1/2007 | Borah et al. .................... 700/83 |
| 2012/0104295 | A1 | * | 5/2012 | Do et al. .................. 251/129.01 |
| 2013/0137358 | A1 | * | 5/2013 | Manahan et al. ............. 454/184 |

FOREIGN PATENT DOCUMENTS

| | | |
|---|---|---|
| DE | 3118446 A1 | 11/1982 |
| DE | 8519474 U1 | 8/1985 |
| DE | 4018825 A1 | 12/1991 |

(Continued)

OTHER PUBLICATIONS

International Search Report mailed May 4, 2010 in PCT/NL2010/050087, 3 pages.

*Primary Examiner* — Bernard Rojas
(74) *Attorney, Agent, or Firm* — Kilpatrick Townsend & Stockton LLP

(57) ABSTRACT

System for controlling electrical equipment units on an offshore structure comprising an explosion proof housing closable with a panel door, at least one controller module mountable in the housing, arranged for autonomously controlling an electrical equipment unit, wherein the panel door comprises an operating module arranged for operating the at least one controller module and for providing status indication of the at least one controller module.

19 Claims, 2 Drawing Sheets

(56) References Cited

FOREIGN PATENT DOCUMENTS

| | | |
|---|---|---|
| DE | 20319489 U1 | 4/2004 |
| GB | 2 278 216 A | 11/1994 |
| WO | 2005/062887 A1 | 7/2005 |
| WO | WO 2005062687 A1 * | 7/2005 |

* cited by examiner

SYSTEM FOR CONTROLLING ELECTRICAL EQUIPMENT UNITS

CROSS-REFERENCES TO RELATED APPLICATIONS

This application is a National Stage of International Application No. PCT/NL2010/050087, filed Feb. 22, 2010, and which claims the benefit of Netherlands Patent Application No. 2002548, filed Feb. 20, 2009, the disclosures of which are incorporated herein by reference.

BACKGROUND OF THE INVENTION

The invention relates to a system for controlling electrical equipment units on an offshore structure.

It is known in the art to control electrical equipment units or peripheral devices, such as navigation aid lanterns, via a main switch box. The switch box usually comprises a housing which can be closed by a panel door. In the housing different electronic elements, such as switches, fuses, relays, printed circuit boards and transformers are mounted which are electrically connected to each other via electrical wires such that an output signal for e.g. one or more lanterns is produced. On the panel door one or more indicators, usually lamps, are provided to indicate the status of the electronic elements and/or of the lanterns. For example, a green lamp signals an operating status and a red lamp signals a defect status. Also, operating buttons and/or switches are provided on the panel door, which when used operate the lantern. Depending on the client's specification one or more lanterns or other peripheral devices are coupled to the switch box and a corresponding number of indicators and operating buttons and/or switches are provided on the panel door.

Drawbacks of the above system are that it can be relatively complex and expensive to manufacture, install, maintain and/or repair.

BRIEF SUMMARY OF THE INVENTION

An object of the invention is to provide a system for controlling electrical equipment on an offshore structure that obviates at least one of the above mentioned drawbacks.

Thereto, according to the invention there is provided a system for controlling electrical equipment units on an offshore structure comprising an explosion proof housing comprising a panel door for closing the housing, at least one controller module mountable in the housing, arranged for autonomously controlling an electrical equipment unit, wherein the housing comprises an operating module arranged for operating the at least one controller module and for providing status indication of the at least one controller module.

By providing a controller module for each electrical equipment unit, a modular system can be obtained in which controller modules can relatively easily be added, removed and/or exchanged. Each controller module is arranged for autonomously controlling the electrical equipment unit connected to it, meaning that it comprises all electronical components which are at least required for controlling the electrical equipment unit connected to it. A single controller module can autonomously control a single electrical equipment unit, no other controllers may be required. In fact, the single controller module can operate as a stand-alone device in the explosion proof housing for controlling the electrical equipment unit connected to it. A single controller module is arranged for executing a single function, i.e. controlling a certain electrical equipment unit. The controller module thus only uses the electronic components of the available electronic components in the controller module that correspond with the function of controlling the electrical equipment unit. For example, a controller module can autonomously control a lantern and therefore uses only the electronic components of the available electronic components that relate to controlling the lantern.

Contrary to the prior art, where an electrical equipment unit is controlled by a combination of many different electronic elements that are arranged at various locations in a switch box. In a prior art switch box, the different electronic elements can be arranged by type, e.g. one row with switches, one row with fuses, one row with printed circuit boards, etc. Controlling a specific electrical equipment unit may require a combination of a connection between a switch, a fuse, a printed circuit board, etc. which are all connected via electrical wiring criss-cross the switch box. This makes controlling the electrical equipment unit failure sensitive, complex and difficult to install, maintain and repair. Also, due to the various electronic elements, installation of the switch box is done offshore, where the work and installation conditions are not always optimal. Further, if a failure occurs in controlling of an electrical equipment unit, every electrical wiring connection needs to be checked to find out where the failure is. This is a complex and time consuming procedure. By providing a controller module according to the invention, all electronic elements are arranged in a single module. From the controller module a single connection to the electrical equipment unit can be established. The controller module can thus be manufactured in an onshore environment under predictable conditions, thereby minimizing failure sensitivity. If a failure occurs in a controller module, the module can easily be replaced as a whole, only the connection with the electrical equipment unit and the operating unit may be removed from the failed controller module and may be reconnected to the replacement controller module. Advantageously, the connection to the electrical equipment unit and/or to the operating module can be a plug-in connection which is relatively easily to connect, unconnect and reconnect.

By providing an operating module for operating the controller module and for providing status indication of the controller module, operations of the controller module can relatively easily be monitored externally, e.g. by an operator on site and/or remotely. Also, by providing an operating module for the modular system, controller modules that are added, removed and/or exchanged can easily be coupled and/or uncoupled from/to the operating module so a minimum interruption of the operations of the system may be obtained and operations can be continued relatively quickly and easily.

Via the operating module the controller module can be operated, e.g. the controller module can be switched on/off or one or more control variables or input/output variables of the controller module can be programmed. Also, the operating module can give a status indication of the controller module. It can e.g. indicate if there is a defect in the controller module and/or in the electrical equipment unit controlled by the controller module. The operating module can be operated by a user, e.g. via a user interface. The operating module then communicates with the controller module and controls the controller module, the controller module provides feedback information to the operating module. The operating module can present the feedback information, e.g. a status indication of the controller module. The controller module on its turn controls autonomously an electrical equipment unit connected to it. The electrical equipment unit may provide feedback information to the controller module.

On an offshore structure the housing usually is explosion proof certified, meaning for example that when an explosion occurs in the housing, the explosion stays in the housing for not harming its surroundings. Explosion proof may also mean that the elements in the housing are arranged such that they cannot provide any sparks, thereby not leading to an explosion when an explosive gas may enter the housing. An explosion proof housing may have to comply e.g. with standard IEC60079, e.g. with EX classification Ex d. Depending on national requirements other and/or additional standards may be applicable.

The controller module can be provided as a box comprising a power input connection for receiving power from a power source, a communication connection for communicating with the operating module and/or a controller module and/or an electrical equipment unit, a power output connection for supplying controlled power to the electrical equipment unit, a converter component for converting input power voltage to output power voltage, an earth fault detector component, a control element with control variables programmable depending on the electrical equipment unit to be controlled, a monitoring element for monitoring input and/or output and/or control variables and a user interface component. All relevant electrical components are thus available in the box of the controller module. The controller module arranged for controlling a specific electrical equipment unit then uses the electrical components needed for controlling the electrical equipment unit, which may be less components than the available components so some available components in the box may remain unused.

An input variable may for example be the input voltage received by the controller module and/or a communication instruction received from the operating module and/or a communication signal received from the electrical equipment unit. An output variable may for example be the output voltage provided by the controller module and/or a communication signal to the operating module and/or a communication signal to the electrical equipment unit. A control variable may be e.g. pulse coding for generating a pulsing, or steady non-pulsing, output voltage, or the synchronisation of day and night status of the controller modules, or the synchronisation of flash or sound characteristics of the controller modules. For example, a navigation aid lantern comprising LED-elements may communicate to the controller module the status of the LED-elements and/or whether there are any defect LED-elements. The monitoring element may e.g. monitor the temperature of the electronic components. An earth fault detector may be provided on the input as well as on the output voltage.

Communication between the controller module and the electrical equipment unit may be performed via a communication protocol, such as e.g. the communication protocol Ortalk™. Also, a power modem communication protocol may be used that makes use of the low voltage situation between e.g. two flashes to a navigation aid light.

By providing the controller module as a box with all electronic components necessary for controlling various electrical equipment units, a flexible and versatile controller module can be obtained. Each box may comprise the aforementioned components, but may also comprise more components. For example, a controller module may also comprise a current limiting device. For some specific applications, the box may also comprise less components.

By providing a box, the controller module can easily be connected/disconnected to/from the operating module and/or the electrical equipment unit. Preferably, each box has similar electrical connection means to facilitate an easy connectability and exchangeability of the boxes. The connection means may be provided on the outside of the box for connecting the box for example to other controller modules, or to the operating module, or to an electrical equipment unit, or to an external computer device.

By providing in the housing a further controller module for autonomously controlling an electrical equipment unit, in fact similar controller modules can be mounted in the housing, thereby obtaining a flexible modular system. Each controller module is arranged and configured such that each controller module individually and autonomously can control an electrical equipment unit.

By configuring the controller modules depending on the electrical equipment unit to be controlled, the controller modules can be flexibly used for different types of electrical equipment units. Via the operating module the controller module can be programmed for specifically controlling the electrical equipment unit connected to it.

During manufacture, the controller module can be supplied with all the electronic components which may be needed for cooperation with a predetermined electrical equipment unit. For example, after manufacturing, during installation or after replacement, the controller module can be programmed via the operating module for performing control operations of the electrical equipment unit. An external configuration device, e.g. an external computer, can be connected to the system, and different settings and/or variables can be set in the operating module for controlling the controller modules. Via the operating module, input, output and/or control variables in the controller module can be programmed, such that the controller module can be prepared for autonomously controlling the specific electrical equipment unit to be connected to it. Variables of the controller module can thus be adapted depending on the electrical equipment unit connected with the controller module.

Controller modules having similar functions and having similar electronic components can be programmed via the operating module for configuring them individually depending on the electrical equipment unit to which each controller module may be connected. By providing similar controller modules that are individually configurable via the operating module, a modular and easy-to-handle system may be obtained.

For example, when an electrical equipment unit is additionally added to the offshore structure, a controller module can be configured to comprise all necessary electronic components for autonomously controlling the newly added electrical equipment unit to be connected to it. The controller module can then be added to the housing and the electrical equipment unit can be connected to the controller module. The configured controller module can further be programmed relatively easy via the operating module to adapt and/or to set variables.

Also replacement of a defective controller module can be done relatively easy by removing the defect controller module and replacing it with a similar one, having all electronic components necessary for controlling the electronic equipment unit, since the controller module is provided with all electronic components for autonomously controlling the electrical equipment unit. In case of replacement, the newly placed controller module may have the same electronic components as the defective controller module. The newly placed controller module can then be programmed via the operating module, and variables of the controller module can be set depending on the electrical equipment unit.

By providing a modular system with similar controller modules, only few modules need to be kept in stock, reducing the costs for stock keeping. Contrary to the prior art switch box, for which many different printed circuit boards, transformers and/or wires need to be kept in stock for service, maintenance and/or repair.

Because the controller module comprises all necessary electronic components for functioning with different electrical equipment units, some electronic components may not be used for certain electrical equipment units. For example, a controller module for a navigation aid lighting unit is configured to control up to four navigation aid lanterns. However, in some situations, only two navigation aid lanterns are required. The controller module can then be programmed, e.g. via the operating module, to control two navigation aid lanterns, thereby leaving some electronic components in the controller module unused and rendering those component superfluous. The control variables of the controller module can then be programmed to control only two, instead of four, navigation aid lanterns.

Also, some electronic components are present in each controller module, whereas in the prior art its function was performed by a single device. For example, each controller module comprises an earth fault detector, whereas a switch box according to the prior art comprises a single earth fault detection system. Depending on the electrical equipment unit connected to the controller module, the earth fault detector is either used or not used. Thus, in some controller modules the earth fault detector can be superfluous.

Thus, a relatively flexible and versatile modular system can be obtained which is relatively easy to manufacture, install, maintain and/or repair.

Depending on the electrical equipment unit connected to the controller module, variables can be programmed differently. For example, when a control variable may control the pulse generation of the output power, it can be understood that the pulse generation for a foghorn unit is programmed differently than e.g. for a navigation aid lighting unit, or for a battery system unit no pulse generation may be required.

Depending on the electrical equipment unit connected to the controller module, the controller module can be configured differently. For example, a controller module for controlling a battery system unit may be configured differently than a controller module for controlling a foghorn unit. For example, for charging a battery system unit a conversion from AC (alternating current) to DC (direct current) may be required and for controlling a navigation aid unit a conversion from DC to AC may be required. Further, control variables for the battery system may be programmed depending on the specific battery system connected to the controller module.

When a defect in the controller module is detected, the defect may be indicated on the operating module. The housing can be opened for example by an operator and the defect controller module can be removed from the housing and can be replaced by a new controller module configured similarly as the defective controller module. The panel door can be closed again. The newly placed controller module then can be programmed via the operating module to perform control operations for the electrical equipment unit. Via the operating module, an operator can program e.g. control variables for adapting the controller module for specifically controlling the electrical equipment unit connected to it. Thus by programming the control variables, the function of the controller module can be adapted depending on the electrical equipment unit to be controlled.

To obtain an explosion proof housing, the operating module is explosion proof arranged in the housing. For example, the operating module can be explosion proof itself. Also, the housing may comprise a structural arrangement for explosion proof receiving the operating module, such as e.g. a reinforced receiving element for receiving the operating module.

Advantageously, the operating module is arranged in the panel door of the housing. The housing may comprise an approximately rectangular rear panel, side panels and the panel door as a front panel. By providing the operating module in the panel door, the operating module can easily be reached for reading status indication and/or for providing input. The operating module can also be arranged at another location on the housing. For example, if the housing comprises a cylindrical tube with a screwing lid on top, the operating module may be arranged in the tubular part of the housing.

By providing the operating module with input means for providing input to the operating module and with display means for displaying the status indication of the controller modules, a relatively flexible and/or easy to handle and/or to install operating module can be obtained. The input means can e.g. be a keyboard, or a computer communication means such as a USB-port for coupling external input means such as an external keyboard to the operating module, or a touch panel for receiving manual input, or an external computer system. Other input means may also be provided. A touch panel may be provided, preferably the whole input screen of the touch panel is touch sensitive instead of providing discrete buttons.

By providing the panel door of the housing with the operating module, the panel door can further be free of any operating means, such as buttons or switches. Contrary to the prior art, where the status indicators are positioned on the panel door, according to the invention the status indicators can be concentrated on the display means of the operating module.

The status indication of the controller modules can be provided on the display means, thus when a controller module is added or removed from the system, the number of status indicators can be changed relatively easy via the operating module. Also, the layout of the status indicators can be adapted relatively easy via the operating module. When providing a touch panel with a screen that is fully touch sensitive, the status indication may be provided on the touch screen as well and/or e.g. the lay-out of the status indication may be easily adapted via the touch screen. Contrary to the prior art, no complex mechanical indicator buttons have to be added or removed from the panel door, which is labour-intensive. Also, in the prior art, adding an indicator to the panel door was relatively difficult, because a new opening has to be drilled in the panel door through which the indicator has to be attached to the panel door and to the respective printed circuit board in the switch box.

By providing a window opening with a reinforced glass panel for receiving the display means and through which the display means may be operable, the housing with the panel door can be explosion proof while the display means can still be operated reliably and safely, either via a touch panel, or via a keyboard or via other input means. The reinforced glass panel can e.g. be a laminated glass panel, or an otherwise reinforced glass panel. The laminated glass panel comprises layers of reinforced glass, e.g. wired glass and/or toughened glass. Between two layers of glass, a touch panel may be provided by arranging for example a matrix of sensitive wires between the layers of glass. The thickness of a first layer of glass is preferably limited to allow sufficient contact with the sensitive wires placed behind it. Preferably, the thickness of the first layer is less than 5 mm. A second layer of glass may be thicker than the first layer and may provide additional and/or sufficient strength to the laminated glass panel. Also, a third layer of glass may be provided.

The operating module can for example also be configured to be connected with a remote operator station, for example on an onshore location. The remote operator station can e.g. collect information regarding different systems for controlling electrical equipment units on different structures. The information that is collected may comprise e.g. status indication, defect detection, monitoring data. Data that may be monitored may e.g. be battery voltage and/or voltage of the electrical equipment unit and/or current level of the electrical equipment unit and/or of the battery. Also, via the remote connection to the operating module, controller modules can be programmed remotely and/or status logging can be performed remotely. Also, the operating module may be provided with an internet connection, to allow configuring or status logging of the operating module and/or of the controller modules from a remote station via the internet.

By providing each controller module with a corresponding footprint for mounting in the housing, the controller modules can be similar and may thus be relatively easy to manufacture, to handle and/or to exchange. Also, by providing the housing with coupling means arranged in a predetermined configuration for receiving a number of controller modules with corresponding footprints, the controller modules can be relatively easily and/or efficiently arranged in the housing. The coupling means can for example be openings or recesses for receiving protrusions or pins or click fingers of the controller modules. Also, the coupling means can be protrusions or pins or click fingers for cooperating with openings or recesses on the controller modules.

By providing the controller modules with corresponding external dimensions, the similarity, exchangeability and modularity of the boxes can be enhanced. The controller modules can be arranged in the same, similar or corresponding boxes, thereby making it easier to arrange the boxes in the housing. In an embodiment, the controller modules may comprise a box with the same, similar or corresponding external dimensions, for example the dimensions are unified and/or standardized, thereby obtaining a standardized modular system. The boxes may be similar or corresponding and may have the same connection means, thereby facilitating the exchangeability of the boxes and making manufacturing, stocking and/or replacing more cost effective.

For an offshore structure the electrical equipment unit can be one of a group of a navigation aid lighting unit, an obstacle lighting unit, a helicopter deck lighting unit, a foghorn unit, a solar cell panel unit and a battery system unit. The controller module may comprise electronic components required for functioning with a predetermined electrical equipment unit. Depending on which electrical equipment unit in fact is connected to the controller module, some electronic components can be used, some electronic components might not be used and some electronic components might be programmed for specifically functioning with the connected electrical equipment unit. An electronic component that might not be used may e.g. be a battery voltage monitoring element if the power is supplied from the mains. An electronic component controlling the pulse generation of the output power may be programmed differently for a foghorn unit than for a navigation aid lighting unit.

A navigation aid lighting unit may for example comprise a main lighting unit, a secondary lighting unit or a subsidiary lighting unit. Also, a helicopter deck lighting unit may comprise a perimeter lighting unit, a flood lighting unit or a touch down marking unit or a helicopter identification marking unit. Navigation aid devices or aids to navigation (AtoN) may comprise a navigation aid lighting unit or a foghorn unit, or a visibility meter device and are designed to mark the offshore structure according to IALA regulations and/or recommendations.

The invention will be elucidated further with reference to an exemplary embodiment represented in a drawing. In the drawing:

DETAILED DESCRIPTION OF THE INVENTION

Figure 1:
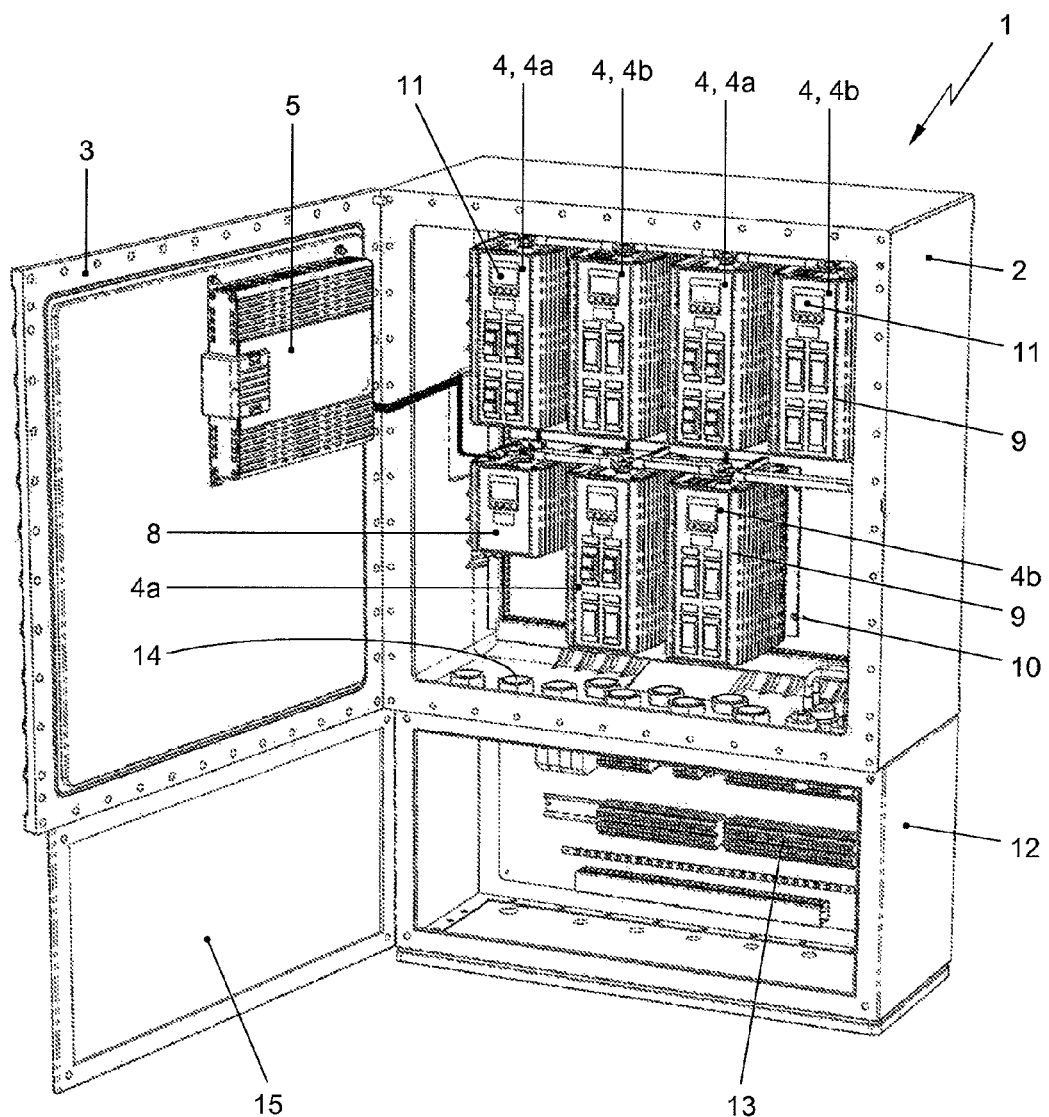
FIG. 1 shows a system according to the invention with the panel door open.

It is noted that the drawings are only diagrammatic and schematic representations of exemplary embodiments of the invention. The embodiments are given by way of non-limiting examples. In the figures, the same or corresponding parts are represented with the same reference numerals.

FIG. 1 discloses a system 1 for controlling electrical equipment units. The system 1 is here a control panel that comprises a housing 2 that can be closed with a panel door 3. Such a system 1 may be placed on an offshore structure for controlling peripheral devices such as a navigation aid lighting unit, an obstacle lighting unit, a helicopter deck lighting unit, a foghorn unit, a solar cell panel unit or a battery system unit. The system 1 may be arranged as a navigation aids central control panel (NCCP) suitable to operate navigation aid peripheral instruments. The system 1 may also be placed on onshore structures, for examples on a tower building, for example for controlling obstacle lighting lanterns placed on the building.

Figure 2:
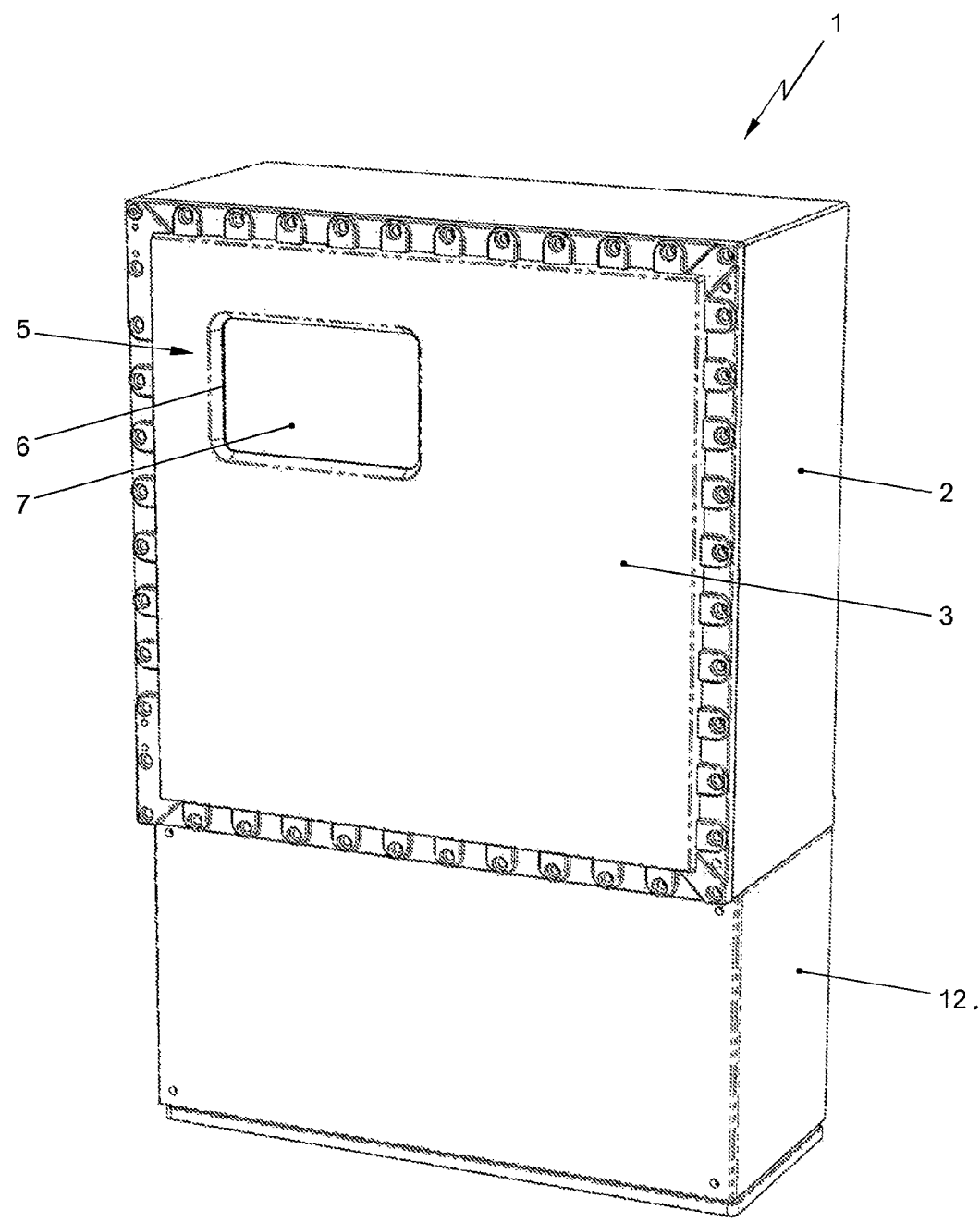
FIG. 2 shows the system of FIG. 1 with the panel door closed.

On an offshore structure, the system 1 usually has to be explosion proof certified. Therefore, the housing 2 and panel door 3 have to comply with requirements for explosion proof equipment. The housing 2 and the panel door 3 can be reinforced and can be made e.g. from aluminium or steel. The panel door 3 can be usually closed on the housing 2 with numerous bolts, as shown in FIG. 2. The system 1 can also be applied in safe areas, where there are no or less explosion proof requirements.

In the embodiment shown in FIG. 1, the housing 2 comprises a number of similar controller modules 4. Each controller module 4 is connected to an electrical equipment unit on the offshore structure. The electrical equipment unit may also be placed on a neighbouring offshore structure.

In the embodiment shown in FIG. 1, two types of controller modules 4 are shown. There are main controller modules 4a and backup controller modules 4b. The backup controller modules 4b have the same electronic components and the same configuration as the main controller modules 4a and are arranged to take over operations of the main controller modules 4a when a defect is detected in the main controller module 4a and the main controller module 4a is disconnected from the system 1.

The electrical equipment unit can be a navigation aid lighting unit, an obstacle lighting unit or a helicopter deck lighting unit or a foghorn unit or a solar cell panel unit or a battery system unit. For example, a navigation aid lighting unit may comprise typically four navigation aid lanterns of 10, 6 or 3 nautical miles or may comprise typically two navigation aid lanterns of 15 nautical miles. For example, a foghorn electrical equipment unit may comprise typically two foghorns of 2 or 0.5 nautical miles. One operating module can control up to 100 controller modules, thus up to 400 navigation aid lanterns of for example 10 nautical miles or up to 200 foghorns. A foghorn or a navigation aid lantern are also known as aids to navigation (AtoN). Also, a visibility meter device can be connected to a controller module 4.

In the panel door 3 an operating module 5 is provided for operating the controller modules 4 and for providing feedback information from the controller modules 4 such as e.g. status indication of the controller modules 4, also shown in FIG. 2. The operating module 5 comprises in this embodiment a display 7 with a touch panel of which preferably the whole screen is touch sensitive, forming a user interface and giving the status indication of the controller modules 4. Thus, the panel door 3 is further free of any operating means, such as buttons or switches. In the panel door 3 a reinforced window opening 6 is provided for receiving the display 7 of the operating module 5. In this embodiment, the window opening 6 comprises a reinforced glass panel behind which the display 7 is placed. The reinforced glass panel can be a laminated glass panel or a glass panel that may be otherwise reinforced, e.g. with wires or toughened. By using a reinforced glass panel the panel door 3 and the housing 2 may comply with explosion proof requirements.

In this embodiment, a touch panel is placed in the laminated glass panel that can be used as a user interface for entering input data, for example for programming the controller modules, so no separate input means may be needed. Also, via the user interface of the touch panel, the layout of the status indicators can be configured. Also defect notifications may appear on the display 7.

The operating module 5 is arranged for operating the controller modules 4. Each controller module 4 is connected to the operating module 5 for communicating with the operating module 5, e.g. operating instructions are received and status information is sent. In this embodiment, the controller modules 4 are connected to the operating module 5 via a communications module 8. The communications module 8 may pass all communication signals from/to the controller modules 4 to/from the operating module 5.

As shown in FIG. 1, each controller module 4 comprises a box 9 with electronic components. The box 9 provides for a housing for the electronic components. All available electronic components for a single controller module are arranged in a single box that houses the electronic components. Preferably, the box provides for a housing that encloses all electronic components in the housing. The box housing then may have only a few connection ports for connection to the operating module and the electrical equipment unit. The box has relatively simple and easy connection ports for connection to the operating module and/or the electrical equipment unit. For example, the connection ports can be plug-in connections.

The electronic components in the box 9 comprise at least a power input connection for receiving power from a power source, a communication connection for communicating with the operating module and/or a controller module and/or an electrical equipment unit, a power output connection for supplying controlled power to the electrical equipment unit, a converter component for converting input power voltage to output power voltage, an earth fault detector component, a control element with control variables programmable depending on the electrical equipment unit to be controlled, a monitoring element for monitoring input and/or output and/or control variables and a user interface element. Each box 9 comprises at least the aforementioned components, but may also comprise more components, e.g. a current limiting component, depending on the electrical equipment unit to be connected to it. By providing each box with similar electronic components a flexible, modular system can be obtained for controlling electrical equipment units in which the boxes can be easily replaced and/or interchanged.

Depending on the electrical equipment unit connected to the box 9, the box 9 can be configured with the electrical components required for controlling that electrical equipment unit. Each box 9 has sufficient electronic components for autonomously controlling a predetermined electrical equipment unit. The electrical equipment only receives operating signals and/or controlling signals from the controller module 4. The electrical equipment unit is only connected to its controller module 4. Thus, depending on the electrical equipment unit connected to the controller module 4, some electronic components may be used, others may not be used and some may have to be configured and/or programmed. Via the operating module 5, control variables can be programmed for performing control operations of the electrical equipment unit connected to it. For example, the controller module box connected to the battery system unit may have to be programmed for monitoring the battery voltage. The control variables regarding input and/or output voltage can then be set, as well as monitoring variables, such as temperature monitoring. Also, the converter component in the controller module box connected to the battery system unit may have to be configured for converting power from AC to DC, e.g. the specific current level and current profiles can then be programmed. Other components in the box, such as e.g. the user interface element or the earth fault detector may not be used.

Communication between electronic components in the controller module 4 and the operating module 5 or the communications module 8 or between controller modules 4 may be performed via a communication protocol such as the communication protocol Ortalk™, developed by Orga B.V. Also, for communication between the controller module and the electrical equipment unit, use can be made of the low voltage situation between two flashes or pulses of e.g. a navigation aid light. Thus, no separate communications line may be required between the controller module and the electrical equipment unit, but use can be made of existing power infrastructure.

As can be seen in FIG. 1, the boxes 9 of the controller modules 4 have a corresponding predetermined footprint for mounting in the housing 2. Advantageously, the housing 2 is provided with coupling means 10 arranged in a predetermined configuration for receiving a number of controller modules 4 with corresponding footprints. In this example, the coupling means 10 are provided as openings for receiving a fastening means with which a box 9 may be coupled to the housing 2. Preferably, the coupling means in the housing are prefabricated. The box 9 is in this example provided with openings in a flange corresponding with the openings in the housing 2. A fastening means, such as a screw, a bolt or a pin, can be inserted in the openings, thereby coupling the box 9 to the housing 2. Alternatively and/or additionally, the box 9 can be mounted in the housing 2 via a snap-fit or a click connection.

The openings in the housing 2 may have a predetermined pattern such that boxes 9 with corresponding and/or congruent footprints relatively easily can be mounted in the housing 2. As can be seen in FIG. 1 the box of the communications module 8 has a footprint that is approximately half the footprint of the boxes 9. The pattern of the coupling means 10 is arranged such that also boxes with a half or a double footprint easily can be mounted in the housing 2. This enhances the flexibility of the system 1. In this embodiment, the boxes 9 also have similar external dimensions and the communications module 8 can be seen as half a box 9 of a controller module 4. Advantageously, each controller module 4 has the same or similar box 9, wherein the box may have external dimensions that are unified and/or standardized to fit in the housing 2. This way a standardized modular system may be obtained.

Each box 9 of a controller module 4 is provided with a user interface component 11. This user interface 11 can be used when the box 9 is provided for a stand-alone operation and does not form part of a system 1. For example, on a relatively small structure on which only a navigation aid light unit may be required, it may suffice to provide a stand-alone controller module 4 that may be operated via the user interface 11. Also, the user interface 11 may be used during service and maintenance for example for checking the configuration of the controller module or for reprogramming or updating certain variables.

In FIG. 1 it can be seen that to the housing 2 a further housing 12 has been coupled. The housing 12 may act as an intermediate chamber between external devices, such as peripheral devices or an external computer and the system 1. For example, wires from an electrical equipment unit may enter the housing 12 and may be connected to coupling elements 13. From the coupling elements 13 wires can be guided through the conductor bushings 14 and be connected to the respective controller module 4. In the housing 12, also a communication port may be provided to which an external computer device may be connected for programming the operating module and/or the controller modules, and/or for providing input to the system 1. The housing 12 may be explosion proof by providing non-sparking elements. A door 15 of the housing 12 may thus be more easily to open than the panel door 3 of the housing 2, making the housing 12 more easily accessible for example for an operator for plugging an external computer device to the system 1.

It may be clear that the invention elucidated above may be applied in onshore structures as well as in safe areas. Also, it may be clear that other electrical equipment units may be connected to the controller modules, such as e.g. a visibility meter, as well as that the controller modules may comprise other electronic components. For example, the controller module may also comprise a voltage overload protection component or a hibernate component or a current limiting device. The hibernate component may e.g. control the voltage of the battery system unit and may initiate a hibernate function of the controller module when the voltage of the battery system unit may be below a predefined level. When the controller module is hibernating minimal current is extracted from the battery system, thereby preventing the battery system for a break down. The hibernate component may be an alternative for a known low voltage disconnect trip coil that disconnects the battery system from the controller module. To reconnect the battery system to the control panel, a switch must be manually reset, which can be expensive on unmanned offshore structures.

Also, it may be clear that the electronic components provided in the controller modules may itself also be modular and/or standardized, thus further reducing the complexity of the system and reducing manufacturing, service, maintenance and/or stocking costs. For example, the electronic components of a controller module may be contained on one printed circuit board instead of being different printed circuit boards connected to each other, as in the prior art.

Many variants will be clear to the person skilled in the art and are understood to fall within the scope of the invention as set forth in the appended claims.

The invention claimed is:

1. System for controlling electrical equipment units on an offshore structure comprising:
    an explosion proof housing comprising a panel door for closing the housing;
    a plurality of controller modules mountable in the housing, wherein each controller module comprises a box for housing electronic components and wherein each controller module is arranged for autonomously controlling an electrical equipment unit;
    wherein the housing comprises an operating module arranged for operating each controller module and for providing status indication of each controller module.

2. System according to claim 1, wherein each controller module comprises a box with:
    a power input connection for receiving power from a power source,
    a communication connection for communicating with the operating module, a controller module, and/or an electrical equipment unit,
    a power output connection for supplying controlled power to the electrical equipment unit,
    a converter for converting input power voltage to output power voltage,
    an earth fault detector,
    a control element with control variables programmable depending on the electrical equipment unit to be controlled,
    a monitoring element for monitoring input, output, and/or control variables, and
    a user interface element.

3. System according to claim 1, wherein the housing comprises a further controller module mountable in the housing for autonomously controlling an electrical equipment unit.

4. System according to claim 3, wherein the controller modules are configurable depending on the electrical equipment unit to be controlled.

5. System according to claim 3, wherein the controller modules are programmable via the operating module.

6. System according to claim 3, wherein the controller modules have a corresponding predetermined footprint for mounting in the housing.

7. System according to claim 6, wherein the housing is provided with coupling means arranged in a predetermined configuration for receiving the plurality of controller modules with corresponding footprints.

8. System according to claim 6, wherein the controller modules have corresponding external dimensions for arrangement in the housing.

9. System according to claim 6, further comprising at least one further box for housing electronic components having a footprint that is half the size of the corresponding predetermined footprint of a controller module for mounting in the housing.

10. System according to claim 6, further comprising at least one further box for housing electronic components having a footprint that is double the size of the corresponding predetermined footprint of a controller module for mounting in the housing.

11. System according to claim 3, wherein a first of the plurality of controller modules is a main controller module and wherein the further controller module is a backup controller module.

12. System according claim 1, wherein the operating module is explosion proof arranged in the housing.

13. System according to claim 12, wherein the operating module is arranged in the panel door.

14. System according to claim 1, wherein the operating module comprises input means for providing input to the operating module and display means for displaying the status indication of the controller modules.

15. System according to claim 14, wherein the panel door comprises a window opening with a reinforced glass panel for receiving the display means and through which the display means are operable.

16. System according to claim 15, wherein the reinforced glass panel comprises the touch panel.

17. System according to claim 14, wherein the input means is a touch panel for receiving manual input.

18. System according to claim 1, wherein the electrical equipment unit is one of a group of: a navigation aid lighting unit, an obstacle lighting unit, a helicopter deck lighting unit, a foghorn unit, a solar cell panel unit and a battery system unit.

19. System according to claim 1, where each controller module comprising a box for housing electronic components is interchangeable with another controller module comprising a box for housing electronic components.

\* \* \* \* \*